United States Patent [19]

Addamiano et al.

[11] Patent Number: 4,745,007

[45] Date of Patent: May 17, 1988

[54] METHOD OF FORMING SILICON CARBIDE FILMS ON TANTALUM CONTAINING SUBSTRATES

[75] Inventors: Arrigo Addamiano, Alexandria, Va.; Philipp H. Klein, Washington, D.C.

[73] Assignee: The United States of America as represented by the Secretary of the Navy, Washington, D.C.

[21] Appl. No.: 770,891

[22] Filed: Aug. 29, 1985

[51] Int. Cl.$^4$ .................. C23C 16/32; B05D 1/35
[52] U.S. Cl. .................. 427/249; 427/255.2; 427/255.4; 427/255.7; 427/419.7
[58] Field of Search .................. 427/93, 111, 95, 228, 427/249, 126.1, 255.7, 419.7, 255.2, 255.4, 397.7; 428/446, 450, 457, 698

[56] References Cited

U.S. PATENT DOCUMENTS 4,196,233  4/1980  Bitzer et al. ..................... 427/249
4,399,168  8/1983  Kullander et al. ............... 427/419.7

FOREIGN PATENT DOCUMENTS 1027713  7/1963  United Kingdom ............... 428/698

OTHER PUBLICATIONS

Powell et al., "Vapor Depositing", pp. 366–367, TS695 P6, 1966.

*Primary Examiner*—Sadie L. Childs
*Attorney, Agent, or Firm*—Thomas E. McDonnell; Andrew M. Lesniak

[57] ABSTRACT

A process for forming a smooth, continuous coating of silicon carbide upon tantalum carbide is disclosed, as are several useful manufacturers produced with the process. A tantalum carbide substrate may be formed directly upon metallic tantulum articles by disclosed means. The material formed with this process has been used to fabricate semiconducting devices including light emitting diodes and selective thermal radiators which can be operate at 1200 degrees C. The method is further useful for producing tantalum metal incandescent light filaments and corrosion resistant tantalum articles.

5 Claims, No Drawings

METHOD OF FORMING SILICON CARBIDE FILMS ON TANTALUM CONTAINING SUBSTRATES

BACKGROUND OF THE INVENTION

The present invention relates generally to a method of applying protective coatings to metals and more particularly to a method of applying smooth, continuous and firmly-adherin layers of silicon carbide on tantalum carbide treated tantalum substrates.

Silicon carbide coatings are useful in many applications which require either stability at high temperatures or corrossion resistance. SiC is virtually inert to strong acids. Furthermore, it is electroluminescent, and it is a non-blackbody selective radiator. This makes it desirable for use in high temperature semiconductor devices and as a coating for incandescent bulb filaments.

However, pure SiC, in the perfect crystalline form required for many of these applications, is difficult to manufacture. Furthermore, SiC crystals have poor structural properties.

OBJECTS OF THE INVENTION

Accordingly, it is an object of this invention to form a coating of silicon carbide upon a substrate with desirable structural properties.

It is a further object of this invention to create a material useful in semiconducting electrical and electronic devices which operate at incandescent temperatures.

It is a further object of this invention to protect tantalum metal articles by providing them with an outer layer of silicon carbide which is resistant to corrosion.

It is yet a further object of this invention to produce a layered material suitable for use in incandescent bulb filaments, such that desired energy emission is enhanced.

Other objects, advantages, and novel features of the present invention will become apparent from the following detailed description of the invention.

SUMMARY OF THE INVENTION

Briefly, these and other objects are achieved by coating a tantalum or tantalum alloy substrate with a layer of tantalum carbide and coating the layer of tantalum carbide with a layer of silicon carbide. In a preferred embodiment the substrate is essentially pure tantalum.

DETAILED DESCRIPTION OF THE PREFERRED EMBODIMENT

The limitations of the prior art are overcome with the present invention by applying SiC as a coating upon a substrate of a material with more desirable structural properties. The substrate material must have properties such that SiC will firmly bond. The thermal expansivity of the substrate must be such that it is compatible with SiC. Furthermore, the substrate material must itself be thermally and chemically compatible with the desired use. In addition, the substrate material must not diffuse into the SiC coating, and thereby cause the coating to lose its desirable qualities.

It has been discovered that a substrate of tantalum carbide, or tantalum carbide over tantalum metal, will act as a suitable substrate for silicon carbide. Smooth, continuous, and firmly adhering layers of silicon carbide of defined thickness can be obtained on tantalum substrates which have been previously coated with a thin layer of chemically formed tantalum carbide. The tantalum substrates may be mono or poly crystalline. Furthermore, a coating of silicon carbide may be applied over very thick layers of tantalum carbide, if desired, or to articles made only of tantalum carbide.

Coated articles produced by the disclosed process have significant practical value in several applications. These include use as selective thermal radiators, oxidation-resistant tantalum heating elements, tantalum containers (e.g. crucibles or beakers) which are resistant to chemical attack (by e.g. hydrofluoric acid or molten fluoride), tantalum susceptors, and tantalum capacitors. Many other applications exist.

Thin even layers of SiC are extremely resistant to attack by acids, including hydrofluoric acid. Tantalum, on the other hand, is readily dissolved by HF, even at room temperature. In one experiment, a 0.004-inch-thick polycrystalline Ta substrate whose upper surface had been coated as described above with a SiC layer about ten micrometers thick was used. It was determined spectroscopically that the lower surface of such a Ta substrate, which rests during the deposition process on the graphite susceptor, is also partically coated, but with a much thinner, nonuniform layer of SiC. Thick silicon carbide coatings will be preferred where protection from chemical attack is needed. Thin layers of SiC are most suitable for use as selective thermal radiators and for fabrication of capacitors. The variations in thickness can be accomplished by changing the SiC deposition time.

The desired layer of silicon carbide is obtained upon a tantalum article by a two-step process. In the first step, a thin surface layer of tantalum carbide is formed upon the tantalum. In the second step, the layer of tantalum carbide acts as the substrate for silicon carbide deposition from a high temperature reaction between silane, propane and hydrogen. Other suitable silicon or carbon containing reactants may be used.

The invention having been generally described, the following examples are given as particular embodiments of the invention and to demonstrate the practice and advantages thereof. It is understood that the examples are given by way of illustration and are not intended to limit the specification or the claims to follow in any manner.

Examples I and II establish how the tantalum carbide and silicon carbide layers of this invention may be formed. Example I utilizes a slice of tantalum as a substrate. Example II utilizes a flat tantalum ribbon substrate.

EXAMPLE I

A polished slice of tantalum, 10 mm in diameter was chemically etched at room temperature in a $H_2O$:$HNO_3$ HF mixture, the volumes being 100:50:10 respectively. After 5 minutes, the tantalum was rinsed in $H_2O$, dried, and put on a support of graphite, which was used as the susceptor of an induction-heating system. The graphite and tantalum assembly was inserted in a quartz tube connected to a manifold that supplied several high-purity gases. The quartz tube was exhausted, flushed with high purity $H_2$ (from a hydrogen purifier), then brought to 1100°–1150° C. in a flow of 1.0 liter per minute of $H_2$ plus 100 ml/min of 1% $C_3H_8$ in $H_2$. After 2 hrs the power was cut off. A smooth, adherent layer of tantalum carbide, having a yellowish appearance, had formed. This tantalum-carbide-coated tantalum was used as substrate for the deposition of silicon carbide.

Deposition of SiC occurred preferentially at 1400° C. in a flow of 1.4 liters per minute of hydrogen plus 42 ml/minute of 1% silane in hydrogen plus 20 ml/minute of 1% propane in hydrogen. The deposition time allowed was 2 hours, a time sufficient to deposit a layer of SiC about 10 micrometers thick. The layer was smooth, crystalline, and adhered well to the substrate.

EXAMPLE II

A tantalum ribbon 0.004 inch in thickness was chemically etched at room temperature in a $H_2O:HNO_3:HF$ mixture, the volumes being 100:50:10 respectively. After 5 minutes, the tantalum was rinsed in $H_2O$, dried, and put on a formed tantalum vessel support, which was used as the susceptor of an induction-heating system. The tantalum vessel and tantalum assembly was inserted in a quartz tube connected to a manifold that supplied several high-purity gases. The quartz tube was exhausted, flushed with high purity $H_2$ (from a hydrogen purifier), then brought to 1100°–1150° C. in a flow of 1.0 liter per minute of $H_2$ plus 100 ml/min of 1% $C_3H_8$ in $H_2$. After 2 hr the power was cut off. A smooth, adherent layer of tantalum carbide, having a yellowish appearance, had formed. This tantalum-carbide-coated tantalum was used as substrate for the deposition of silicon carbide.

Deposition of SiC occurred preferentially at 1400° C. in a flow of 1.4 liters per minute of hydrogen plus 42 ml/minute of 1% silane in hydrogen plus 20 ml/minute of 1% propane in hydrogen. The deposition time allowed was 2 hours, a time sufficient to deposit a layer of SiC about 10 micrometers thick. The layer was smooth, crystalline, and adhered well to the substrate.

Great increases in durability of SCC Ta can be expected if both surfaces of the piece are coated with about 10 micrometers of SiC. Thin ribbons could be coated on both sides simultaneously, if they were suitably clamped, held in tension, and heated by passage of an electric current through them.

To verify the protection afforded the Ta by the present coating a coated piece of Ta was exposed along with a bare piece with nearly identical area, to hydrofluoric acid at 25° C., at 62° C., and at 72° C. At room temperature, the bare Ta lost nearly 500 times as much weight in 94 minutes of exposure of HF as did the SCC Ta piece (3.94% vs 0.0083%). Weight loss of the uncoated Ta during an hour in HF at 62° C. was almost 1.5 times as great as was the case for SCC Ta (16.5% lost from the uncoated piece, 11.1% lost from the SCC piece). After an additional 50 minutes at 72° C., the bare specimen had completely disappeared, while about 30% of the SCC Ta remained.

Obviously, numerous (additional) modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method for forming smooth and adherent SiC films on tantalum or tantalum alloy substrates comprising the steps of:
   coating a tantalum or tantalum alloy substrate with a layer of tantalum carbide; and
   coating the said layer of tantalum carbide with a layer of silicon carbide.

2. The method of claim 1 wherein the substrate coating step comprises coating a substrate of essentially pure tantalum.

3. The method of claim 2 wherein the said essentially pure tantalum in said substrate coating step (a) is monocrystalline tantalum.

4. The method of claim 2 wherein the substrate coating step (a) comprises the steps of:
   heating the substrate to a temperature sufficient to cause the tantalum to react with propane; and
   exposing the substrate to a flow of carboncontaining gas.

5. The method of claim 4 wherein the tantalum carbide layer coating step (b) comprises the steps of:
   heating the said tantalum carbide layer; and
   exposing the tantalum carbide layer to a flow of gas containing both silicon and carbon.

* * * * *